(12) United States Patent
Lai et al.

(10) Patent No.: US 11,393,512 B2
(45) Date of Patent: Jul. 19, 2022

(54) MEMORY DEVICE

(71) Applicant: Taiwan Semiconductor Manufacturing Company, Ltd., Hsinchu (TW)

(72) Inventors: Chien-An Lai, Hsinchu County (TW); Chung-Cheng Chou, Hsin-Chu (TW); Yu-Der Chih, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/061,600

(22) Filed: Oct. 2, 2020

(65) Prior Publication Data

US 2021/0151086 A1 May 20, 2021

Related U.S. Application Data

(60) Provisional application No. 62/935,830, filed on Nov. 15, 2019.

(51) Int. Cl.
*G11C 7/22* (2006.01)
*G11C 7/10* (2006.01)
(Continued)

(52) U.S. Cl.
CPC ............. *G11C 7/222* (2013.01); *G11C 7/106* (2013.01); *G11C 7/1087* (2013.01); *G11C 7/14* (2013.01);
(Continued)

(58) Field of Classification Search
CPC ...... G01C 7/222; G01C 7/106; G01C 7/1087; G01C 7/14; G01C 13/0026; G01C 13/0038; G01C 13/004; G01C 13/0069; G01C 2213/79; G01C 2213/82; G01C 5/147; G01C 13/003; G01C 7/04; G01C 13/0033; G01C 2013/0071
See application file for complete search history.

(56) References Cited

U.S. PATENT DOCUMENTS 6,008,674 A 12/1999 Wada et al.
7,050,333 B2 * 5/2006 Matsue .................. G11C 16/10
365/185.28

(Continued)

FOREIGN PATENT DOCUMENTS

KR 10-0929304 B1 11/2009
TW 201913665 A 4/2019

*Primary Examiner* — Tri M Hoang
(74) *Attorney, Agent, or Firm* — Merchant & Gould P.C.

(57) ABSTRACT

A memory device is provided, the memory device includes multiple cells arranged in a matrix of multiple rows and multiple columns. The memory device further includes multiple bit lines each of which is connected to first cells of the multiple cells arranged in a row of the multiple rows. A voltage control circuit is connectable to a selected bit line of the multiple bit lines and includes a voltage detection circuit that detects an instantaneous supply voltage and a voltage source selection circuit connected to the voltage detection circuit. The voltage source selection circuit selects a voltage source from multiple voltage sources based on the detected instantaneous supply voltage. The voltage source selection circuit includes a switch that connects the selected voltage source to the selected bit line to provide a write voltage.

20 Claims, 9 Drawing Sheets

(51) Int. Cl.
 *G11C 7/14* (2006.01)
 *G11C 13/00* (2006.01)
(52) U.S. Cl.
 CPC ........ *G11C 13/004* (2013.01); *G11C 13/0026* (2013.01); *G11C 13/0038* (2013.01); *G11C 13/0069* (2013.01)

(56) References Cited

U.S. PATENT DOCUMENTS

| | | |
|---|---|---|
| 7,057,958 B2 | 6/2006 | So et al. |
| 8,942,050 B2 | 1/2015 | Tomotani et al. |
| 9,202,579 B2 | 12/2015 | Hsiung et al. |
| 9,281,029 B2 | 3/2016 | Cernea |
| 10,347,358 B2 | 7/2019 | Kim et al. |
| 10,388,383 B2 | 8/2019 | Song |
| 2004/0213068 A1* | 10/2004 | Matsue .................. G11C 16/10 365/226 |
| 2011/0235457 A1 | 9/2011 | Hirata |
| 2012/0314481 A1 | 12/2012 | Close et al. |
| 2019/0227611 A1 | 7/2019 | Nam et al. |

\* cited by examiner

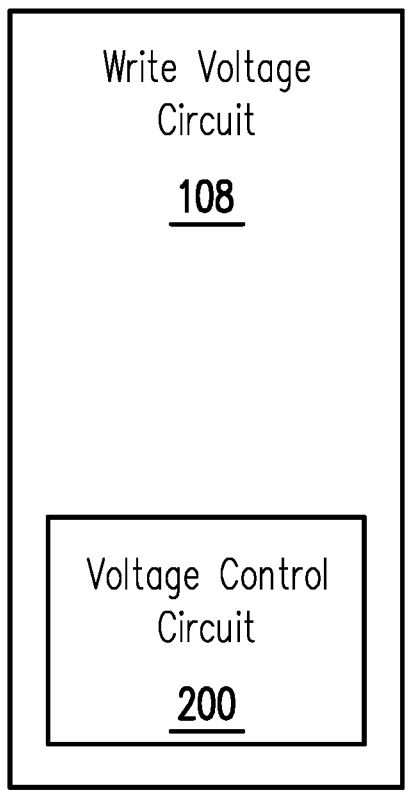
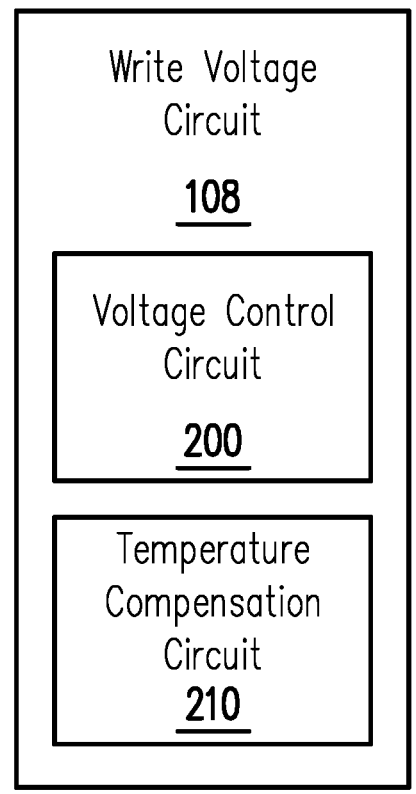
FIG. 2A
FIG. 2B

MEMORY DEVICE

CROSS-REFERENCE TO RELATED APPLICATION

This application claims priority to U.S. Provisional Patent Application No. 62/935,830, filed Nov. 15, 2019, the disclosure of which is hereby incorporated by reference in its entirety.

BACKGROUND

Integrated circuit (IC) memory devices include resistive memory, such as resistive random-access memory (RRAM), magnetoresistive random-access memory (MRAM), phase-change random-access memory (PCRAM), etc. The resistive memory stores information by changing a resistance of a dielectric material. For example, RRAM is a memory structure including an array of RRAM cells each of which stores a bit of data using resistance values, rather than electronic charge. Particularly, each RRAM cell includes a resistive material layer, the resistance of which can be adjusted to represent logic "0" or logic "1".

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

FIG. 2A is a block diagram generally illustrating an example write voltage circuit for a memory device in accordance with some embodiments.

FIG. 2B is a block diagram generally illustrating another example write voltage circuit for a memory device in accordance with some embodiments.

DETAILED DESCRIPTION

Figure 1A:
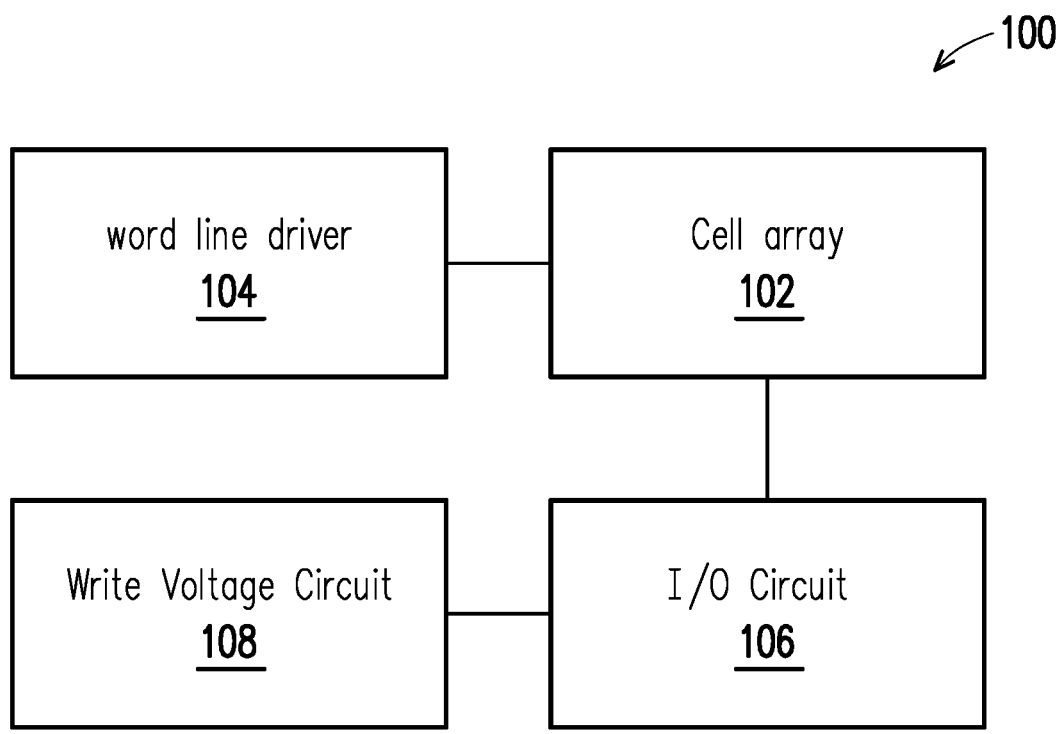
FIG. 1A is a block diagram generally illustrating an example memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some Integrated circuit (IC) memory devices, such as resistive random-access memory (RRAM), variations in bit-line (BL) or source line (SL) voltages during read and write operations occurs. In addition, the variations in the BL voltage can also occur as a function of temperature as well. This disclosure provides techniques for providing a suitable bit line voltage for write operations for a memory device and a way to compensate for the variations in the bit line voltage during the write operations due to variations in temperature.

FIG. 1A is a block diagram illustrating an example memory device 100 in accordance with some embodiments. In some examples, memory device 100 is a resistive memory device, such as resistive random-access memory (RRAM). As shown in FIG. 1A, memory device 100 includes a cell array 102, a word line driver 104, an Input/Output (I/O) circuit 106, and a write voltage circuit 108. Although write voltage circuit 108 is shown to be separate from I/O circuit 106, write voltage circuit 108 can be part of I/O circuit 106. In addition, it will be apparent to a person with ordinary skill in the art after reading this disclosure that memory device 100 can include more components or fewer components than those shown in FIG. 1.

Figure 1B:
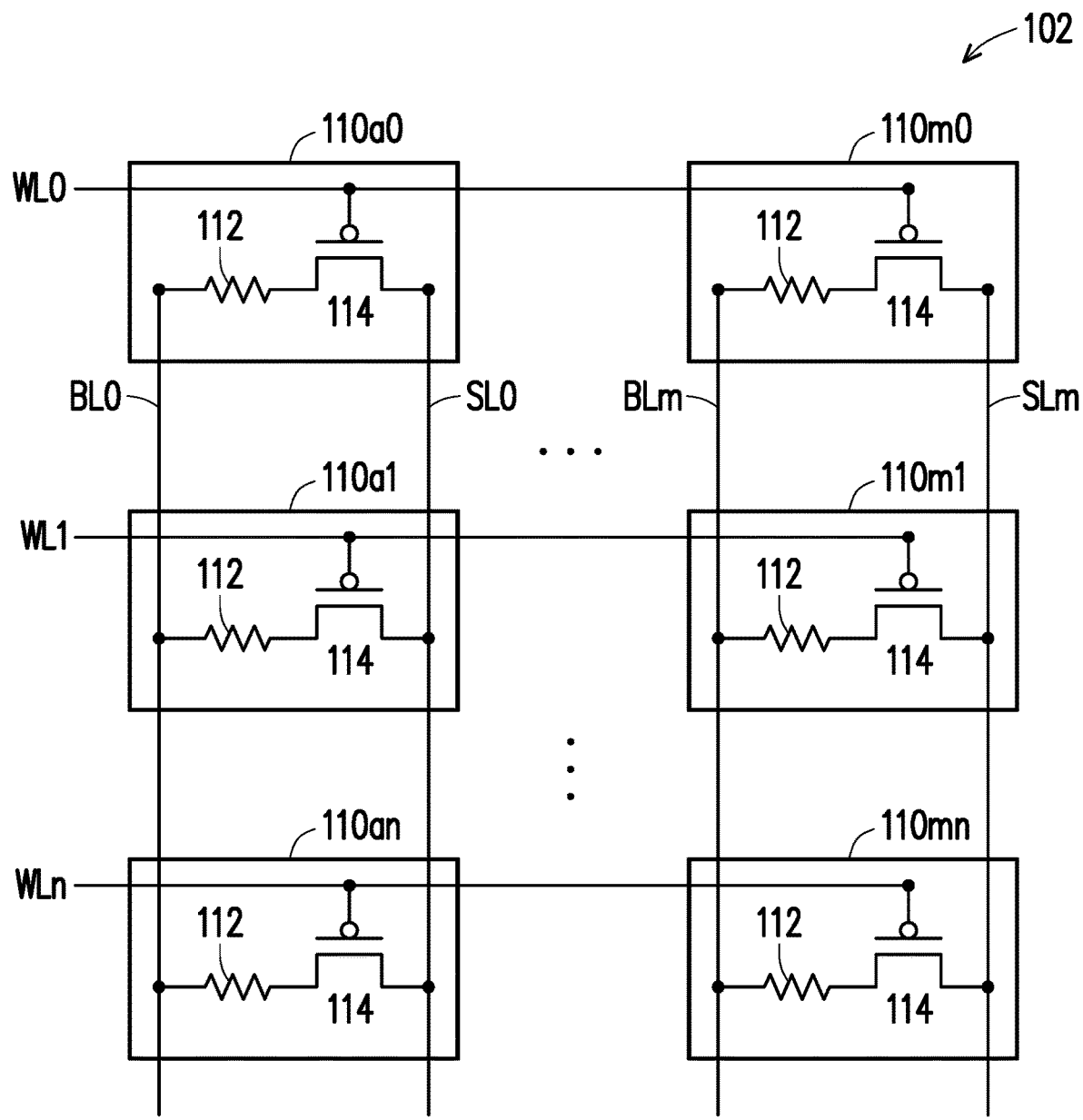
FIG. 1B is a block diagram generally illustrating an example cell array of a memory device in accordance with some embodiments.

FIG. 1B is a block diagram illustrating an example cell array 102 of example memory device 100 in accordance with some embodiments. As shown in FIG. 1B, cell array 102 includes a plurality of cells labeled as 110a0, 110m0, 110a1, 110m1, 110an, 110mn (collectively referred to as plurality of memory cells 110). Each of the plurality of cells 110 can store one bit of information (that is, a bit value 0 or a bit value 1). Therefore, each of the plurality of cells 110 are also referred to as a bit cell or a memory cell.

In some examples, plurality of cells 110 of cell array 102 can include resistive memory cells. Resistive memory cells include a resistive element having a layer of high-k dielectric material arranged between conductive electrodes disposed within a back-end-of-the-line (BEOL) metallization stack. Resistive memory cells are configured to operate based upon a process of reversible switching between resistive states. This reversible switching is enabled by selectively forming a conductive filament through the layer of high-k dielectric material. For example, the layer of high-k dielectric material, which is normally insulating, can be made to conduct by applying a voltage across the conductive electrodes to form a conductive filament extending through the layer of high-k dielectric material. A resistive memory cell having a first (e.g., high) resistive state corresponds to a first data value (e.g., a logical '0') and a resistive memory cell having a second (e.g., low) resistive state corresponds to a second data value (e.g., a logical '1').

As shown in FIG. 1B, the plurality of cells 110 of cell array 102 are arranged in a matrix having a plurality of rows (for examples, n rows) and a plurality of columns (for example, m columns). Each row of the plurality of rows includes a first plurality of cells of the plurality of cells. For example, 0th row of cell array 102 include a first plurality of cells labeled as 110a0, 110m0. Similarly, $1^{st}$ row of cell array 102 includes a first plurality of cells labeled as 110a1, 110 ml. Lastly, $n^{th}$ row of cell array 102 includes a first plurality of cells labeled as 110an, . . . , 110mn.

Similarly, each column of the plurality of columns includes a second plurality of cells of the plurality of cells. For example, 0th column of cell array 102 include a second plurality of cells labeled as 110a0, 110al, . . . , 110an. Similarly, $m^{th}$ column of cell array 102 include a second plurality of cells labeled as 110m0, 110m1, . . . , 110mn.

Cell array 102 further includes a plurality of word lines (for example, WL0, WL1, . . . , WLn) and a plurality of bit lines (for example, BL0, . . . , BLm). Each of the plurality of word lines is associated with a row of the plurality of rows. For example, each of the first plurality of cells in a row of the plurality of rows is connected to a word line of the plurality of word lines. As shown in FIG. 1B, the first plurality of cells labeled as 110a0, . . . , 110m0 of the $0^{th}$ row are connected to word line WL0. Similarly, the first plurality of cells labeled as 110a1, . . . , 110m1 of the $1^{st}$ row are connected to word line WL1. Lastly, the first plurality of cells labeled as 110an, . . . , 110mn of the $n^{th}$ row are connected to word line WLn.

Similarly, each bit line of the plurality of bit lines is associated with a column of the plurality of columns. For examples, each of the second plurality of cells of a column of the plurality of columns is coupled to a bit line of the plurality of bit lines. As shown in FIG. 1B, the second plurality of cells labeled as 110a0, 110al, . . . , 110an of the $0^{th}$ column are connected to bit line BL0. Similarly, the second plurality of cells labeled as 110m0, 110m1, . . . , 110mn of the $m^{th}$ column are connected to bit line BLm.

Thus, each of the plurality of cells of cell array 102 is associated with an address defined by an intersection of a word line and a bit line. In some examples, cell array 102 further includes a plurality of source lines (for example, SL0, . . . , SLm). Each source line of the plurality of source line is also associated with a column of the plurality of columns. For example, the second plurality of cells of a column is coupled to a source line of the plurality of source lines. As shown in FIG. 1B, the second plurality of cells labeled as 110a0, 110al, . . . , 110an of the $0^{th}$ column are connected to source line SL0. Similarly, the second plurality of cells labeled as 110m0, 110m1, . . . , 110mn of the $m^{th}$ column are connected to source line SLm.

In some examples, and as shown in FIG. 1B, each of plurality of cells 110 of cell array 102 include a resistive memory element 112 and an access transistor 114. Resistive memory element 112 has a resistive state that is switchable between a low resistive state and a high resistive state. The resistive states are indicative of a data value (e.g., a "1" or "0") stored within resistive memory element 112. Resistive memory element 112 has a first terminal coupled to a bit line and a second terminal coupled to access transistor 114. Access transistor 114 has a gate coupled to a word line, a source coupled to source line and a drain coupled to the second terminal of resistive memory element 112. In examples, access transistor 114 can be symmetrical. That is, a drain of access transistor 114 can be a source and a source of access transistor 114 can be a drain.

To read data from or to write data into cell array 102, a word line of the plurality of word lines is selected and charged to a predetermined voltage, for example, a word line voltage VWL. In addition, a bit line of the plurality of bit lines and a source line of the plurality of source lines are selected and pre-charged to a predetermined voltages, for example, BL/SL voltages (VBL/VSL). The applied voltages cause a sense amplifier to receive a signal having a value that is dependent upon a data state of a cell of cell array 102.

Returning to FIG. 1A, word line driver 104 selects a word line of the plurality of word lines and charge the selected word line to a predetermined voltage, for example, a word line voltage $V_{WL}$. Word line driver 104 selects the word line to charge based on decoding an address provided by a plurality of address lines. As shown in FIG. 1A, word line driver 104 is connected to cell array 102.

I/O circuit 106 applies the BL/SL voltages (that is, VBL/VSL) to a selected bit line and a selected source line during read-write operations. In some embodiments, I/O circuit 106 includes circuitry for multiplexing and encoding, and demultiplexing and decoding data to be written to, or read from, cell array 102, as well as circuitry for pre-charging a selected bit line and a selected source line for read-write operations. In some embodiments, I/O circuit 106 includes circuitry for amplifying read-write signals received from or applied to a selected bit line and a selected source line. In general, I/O circuit 106 includes one or more circuitry necessary to control a selected bit line and a selected source line voltages for all SET, RESET, and READ operations executed on cell array 102 of resistive memory cells. As shown in FIG. 1A, I/O circuit 106 is connected to cell array 102.

Continuing with FIG. 1A, write voltage circuit 108 provides a write voltage to be applied to a selected bit line of cell array 102. In addition, write voltage circuit 108 compensates for variations in the write voltage due to variation in a temperature of cell array 102. Write voltage circuit 108 improves write margins for cell array 102. For example, write voltage circuit 108 reduces variation in the write voltage along the bit lines of cell array 102. In example embodiments, and as discussed in detail in the following sections of the disclosure, write voltage circuit 108 includes a voltage control circuit, also referred to as a power switching system, which automatically selects a suitable power source for a write driver. Moreover, and as discussed in detail in the following sections of the disclosure, write voltage circuit 108 also provides a temperature related reference signal to accommodate mobility degradation on a write operation for cell array 102 due to variation in a temperature of cell array 102.

FIG. 2A illustrates a block diagram illustrating write voltage circuit 108 in accordance with example embodiments. As shown in FIG. 2A, write voltage circuit 108 includes a voltage control circuit 200. Voltage control circuit 200 (also referred to as a power switching system or a power switch scheme) uses a resistor ladder to detect a voltage level of a power supply and compare it with a known voltage source (that is, VBG). Voltage control circuit 200 then uses the detected voltage level to select a suitable power source for a write driver. The selection of the suitable power source is automatic. Voltage control circuit 200 is described in greater detail with reference to FIG. 3 of the disclosure.

In addition, and as shown in FIG. 2B, in some examples, write voltage circuit 108 further includes a temperature compensation circuit 210. Temperature compensation circuit 210 (also referred to as temperature compensation scheme) generates a temperature dependent reference signal for the write driver. The temperature dependent reference signal is then be used to compensate the write-ability loss on high temperature and prevent device stress on low temperature. The temperature dependent reference signal is designed to align its level on a room temperature. No extra trimming may be needed. In addition, the temperature dependent reference signal is capable of adapting to different write voltage levels automatically. Temperature compensation circuit 210 is described in greater detail with reference to FIG. 4 of the disclosure.

Figure 3:
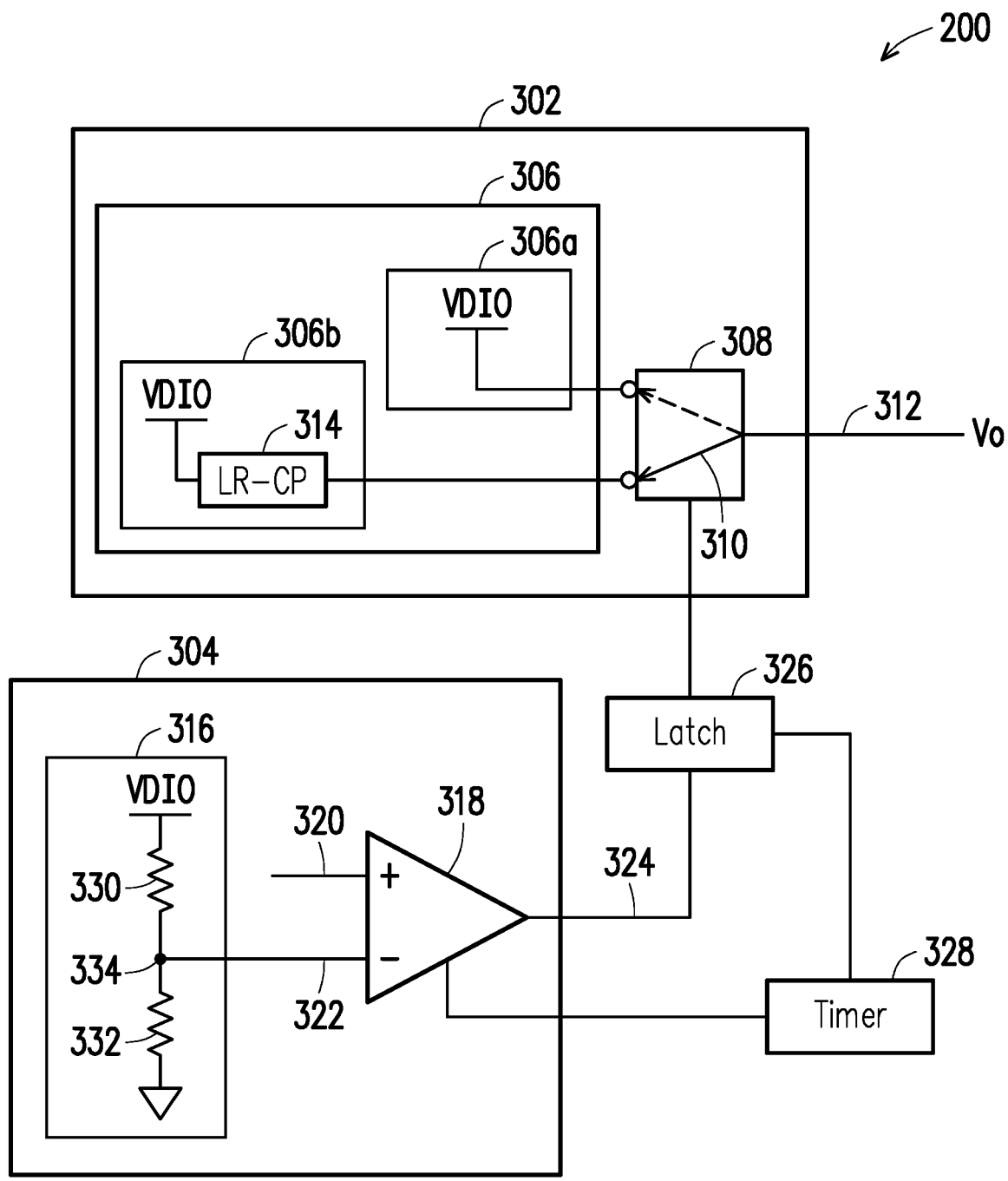
FIG. 3 is a block diagram generally illustrating an example voltage control circuit in accordance with some embodiments.

FIG. 3 is a block diagram illustrating an example voltage control circuit 200 in accordance with some embodiments. As shown in FIG. 3, voltage control circuit 200 includes a voltage source selection circuit 302 and a voltage detection circuit 304. Voltage source selection circuit 302 is connected to voltage detection circuit 304. Voltage detection circuit 304 detects an instantaneous supply voltage (also referred to as VDIO) and provides the detected instantaneous supply voltage to voltage source selection circuit 302. Voltage source selection circuit 302 selects a voltage source from a plurality of voltage sources based on the detected instantaneous supply voltage. For example, and as discussed in the following portions of the disclosure, voltage source selection circuit 302 includes a switch that connects the selected voltage source to a selected bit line to provide a write voltage.

As shown in FIG. 3, voltage source selection circuit 302 includes a plurality of voltage sources 306 which includes, for example, a first voltage source 306a and a second voltage source 306b. In some examples, first voltage source 306a corresponds to a supply voltage level (that is, VDIO) and second voltage source 306b corresponds to an increased supply voltage level. For example, and as shown in FIG. 3, second voltage source 306b includes a low ripple charge pump (that is LR-CP) 314 connected to a supply voltage node. LR-CP 314 increases the supply voltage level thereby providing an increased supply voltage level of second voltage source 306b. Although voltage source selection circuit 302 is shown to include only two voltage sources (that is, first voltage source 306a and a second voltage source 306b), it will be apparent to a person with ordinary skill in the art after reading this disclosure that voltage source selection circuit 302 can include more than two voltage sources.

In addition, voltage source selection circuit 302 includes a switch 308. In examples, switch 308 is a multi-domain power switch. For example, switch 308 is dual domain power switch. Switch 308 includes an input terminal 310 and an output terminal 312. Switch 308 selects one of plurality of voltage sources 306 and provide a voltage level associated with the selected one of plurality of voltage sources 306 at output terminal 312. For instance, to select one of plurality of voltage sources 306, input terminal 310 of switch 308 is connected to a selected voltage source node. Switch 308 selects one of plurality of voltage sources 306 based on the instantaneous supply voltage. For example, switch 308 receives a signal representative of the instantaneous supply voltage from voltage detection circuit 304.

Voltage detection circuit 304 includes a resistor ladder 316 and a first comparator 318. Resistor ladder 316 includes a first resistor 330 and a second resistor 332. A first terminal of first resistor 330 is connected to a supply voltage node (that is, VDIO) and a second terminal of first resistor 330 is connected to a first reference node 334. A first end of second resistor 332 is connected to first reference node 334 and a second terminal of second resistor 332 is connected to ground. In examples, a resistance value of first resistor 330 is equal to a resistance value of second resistor 332. However, it will be apparent to a person with ordinary skill in the art after reading this disclosure that the resistance values of first resistor 330 and second resistor 332 can be different. In addition, although resistor ladder 316 is shown to include only two resistors (that is, first resistor 330 and a second resistor 332), it will be apparent to a person with ordinary skill in the art after reading this disclosure that resistor ladder 316 can include more than two resistors.

Resistor ladder 316 provides a voltage which is a representative of instantaneous value of the supply voltage (that is, VDIO) at first reference node 334. For example, first reference node 334 provides a half of the supply voltage (that is, ½(VDIO)). The representative voltage of the instantaneous value of the supply voltage (also referred to as instantaneous supply voltage hereinafter) is provided to first comparator 318. First comparator 318 compares the instantaneous supply voltage with a reference voltage, for example, a band gate voltage (that is, VBG). In some examples, first comparator 318 is an amplifier, such as, an operational amplifier.

For example, first comparator 318 includes a first input terminal 320, a second input terminal 322, and an output terminal 324. First input terminal 320 of first comparator 318 is connected to a band gap voltage node and second input terminal 322 of first comparator 318 is connected to first reference node 334 of resistor ladder 316. First comparator 318 compares the instantaneous supply voltage received at second input terminal 322 with the reference voltage received at first input terminal 320 and provides comparison result at output terminal 324. In example embodiments, the comparison result indicates whether the instantaneous supply voltage is greater than or less than the reference voltage.

The comparison result from first comparator 318 is provided to switch 308. For example, output terminal 324 of first comparator 318 is connected to switch 308. Switch 308 selects one of plurality of voltage sources 306 based on the comparison result. For example, switch 308 selects first voltage source 306a of plurality of voltages sources 306 when the comparison result indicates that the instantaneous supply voltage is equal to or more than the reference voltage. Moreover, switch 308 selects second voltage source 306b of plurality of voltage sources 306 when the comparison result indicates that the instantaneous supply voltage is less than the reference voltage.

In some embodiments, voltage control circuit 200 includes a latch 326 and a timer 328. Timer 328 keeps track of time periods and generates a first trigger signal after a first predetermined time period and generates a second trigger signal after a second predetermined time period. In some examples, the second trigger signal is generated after the first trigger signal. The first trigger signal triggers first comparator 318 to compare the instantaneous supply voltage with the reference voltage. The second trigger signal triggers latch 326 to store the comparison result from first comparator 318. After latching of the comparison result, first comparator 318 can be switched off to save power. In example embodiments, latch 326 can be a flip-flop. Moreover, latch 326 can be used to speed up detection delay.

Figure 4:
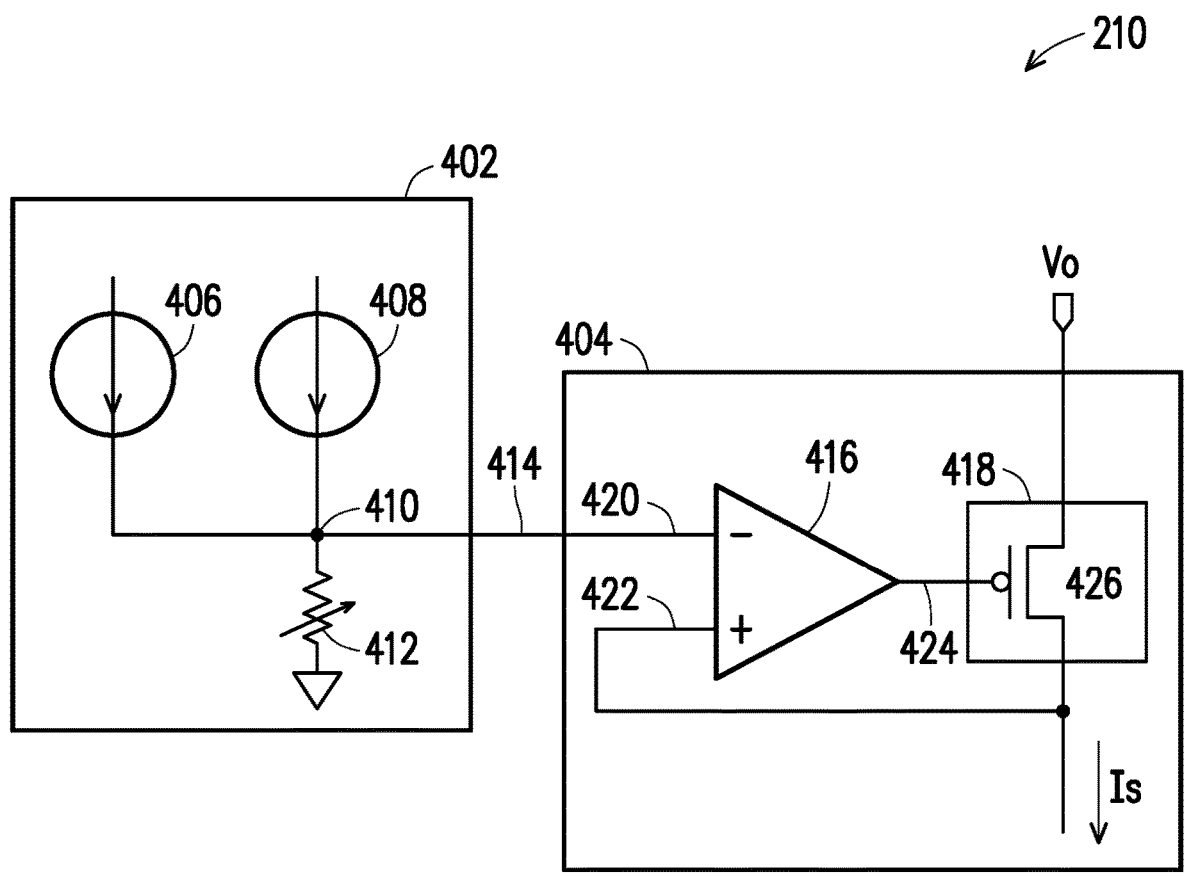
FIG. 4 is a block diagram generally illustrating an example temperature compensation circuit in accordance with some embodiments.

FIG. 4 is a block diagram generally illustrating an example temperature compensation circuit 210 in accordance with some embodiments. As shown in FIG. 4, temperature compensation circuit 210 includes a reference voltage generator circuit 402 and a voltage regulator circuit 404. Voltage regulator circuit 404 is connected to reference voltage generator circuit 402. Reference voltage generator circuit 402 generates a temperature compensated reference voltage and provides the temperature compensated reference voltage to voltage regulator circuit 404. Voltage regulator circuit 404 compares the temperature compensated reference voltage with an instantaneous bit line voltage and regulates the instantaneous bit line voltage based on the comparison.

As shown in FIG. 4, reference voltage generator circuit 402 includes a first current source 406 and a second current source 408. First current source 406 is connected in parallel with second current source 408 at a second reference node 410. First current source 406 sinks a first current at second reference node 410 and second current source 408 sinks a second current at second reference node 410. In some examples, first current source 406 is a Proportional to Absolute Temperature (PTAT) current source and the second current source 408 is a Zero Temperature Coefficient (ZTC) current source. An example, PTAT current source is discussed in greater detail with reference to FIG. 5 of the disclosure.

In some examples, a PTAT current generated by the PTAT current source (that is, first current source 406) is proportional to an absolute temperature and increases or decreases in a same direction as the temperature increases or decreases. A ZTC current generated by the ZTC current source (that is, second current source 408) have a temperature coefficient of zero with absolute temperature. That is, the ZTC current is substantially invariable relative to absolute temperature. The PTAT current and the ZTC current are used in a combination to generate a bias current for reference voltage generator circuit 402. For example, slopes (that is rate of increase or decrease) of the PTAT current and the ZTC current are controlled using trim codes so that the bias current for reference voltage generator circuit 402 remains same at a specified temperature (for example, at room temperature) when the slopes are changed.

Reference voltage generator circuit 402 further includes a variable resistor 412. A first terminal of variable resistor 412 is connected to second reference node 410 and a second terminal of variable resistor 412 is connected to ground. In some examples, a resistance value of variable resistor 412 is changed to adjust the bias current for reference voltage generator 402. The temperature compensated reference voltage is generated at second reference node 410 and is provided at an output terminal 414 of reference voltage generator circuit 402. In examples, the temperature compensated reference voltage generated at output terminal 414 of reference voltage generator circuit 402 is provided to voltage regulator circuit 404.

Continuing with FIG. 4, voltage regulator circuit 404 includes a second comparator 416 and a third current source 418. Third current source 418 is connected to second comparator 416. Second comparator 416 includes a first input terminal 420, a second input terminal 422, and an output terminal 424. First input terminal 420 is connected to output terminal 414 of reference voltage generator circuit 402. Second input terminal 422 is connected to a selected bit line of cell array 102. In examples, second comparator 416 compares the temperature compensated reference voltage received at first input terminal 420 with an instantaneous bit line voltage received at second input terminal 422 and provides a comparison result on output terminal 424. The comparison result may include whether the instantaneous bit line voltage is less than or greater than the temperature compensated reference voltage.

The comparison result is provided to third current source 418. Third current source 418 varies an amount of a source current Is being sinked to the selected bit line based on the comparison result. For example, third current source 418 increases the amount of the source current Is being sinked to the selected bit line when the temperature compensated reference voltage is more than the instantaneous bit line voltage. Moreover, third current source 418 decreases the amount of the source current Is being sinked to the selected bit line when the temperature compensated reference voltage is less than the instantaneous bit line voltage.

In examples, third current source 418 comprises a transistor 426. A source of transistor 426 is connected to a write voltage node and a drain of transistor 426 is connected to a selected bit line of cell array 102. A gate of transistor 426 is connected to output terminal 424 of comparator 416. In some examples, transistor 426 is a p-channel metal oxide semiconductor (pMOS) transistor. However, it will be apparent to a person with an ordinary skill in the art after reading this disclosure that other types of transistors, such as, a metal oxide semiconductor field effect transistor (MOSFET), an n-channel metal oxide semiconductor (nMOS) transistor, or a complementary metal oxide semiconductor (CMOS) transistor can be used for transistor 426. In addition, transistor 426 is symmetrical. That is, a source of transistor 426 can be a drain, and a drain of transistor 426 can be a source.

In examples, a unigain buffer can be connected between reference voltage generator circuit 402 and voltage regulator circuit 404. The unigain buffer shields reference voltage generator circuit 402 from kick back noise generated by voltage regulator circuit 404. In other examples, voltage regulator circuit 404 is a low dropout (LDO) circuit. In some examples, second comparator 416 is an amplifier, such as, an operational amplifier.

Figure 5:
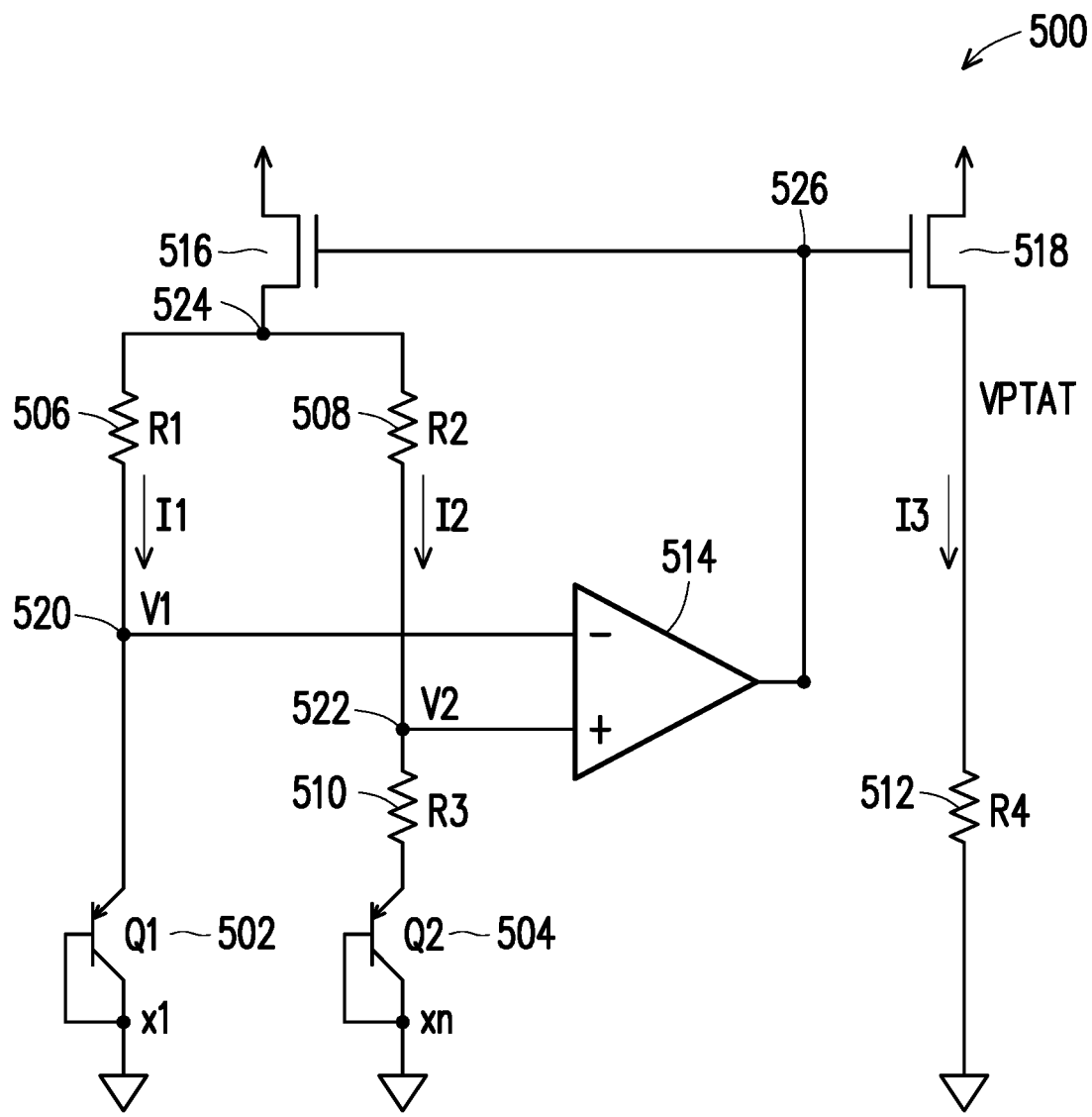
FIG. 5 is an example of a circuit for a PTAT current source in accordance with some embodiments.

FIG. 5 is an example of a circuit of a PTAT current source 500 in accordance with some embodiments. In example embodiments, PTAT current source 500 includes a bandgap reference (BGR) circuit. PTAT current source 500 is a temperature independent current source that outputs a fixed (constant) current regardless of temperature changes. In some examples, PTAT current source 500 outputs a PTAT current that varies linearly with temperature. As shown in FIG. 5, PTAT current source 500 includes a first transistor Q1 502 and second transistor Q2 504. In addition, PTAT current source 500 includes a first resistor R1 506, a second resistor R2 508, a third resistor R3 510, and a fourth resistor R4 512. Moreover, PTAT current source 500 includes a third comparator 514, a first current mirror 516, and a second current mirror 518.

First transistor Q1 502 is connected between a first node 520 and ground. A first terminal of first resistor R1 506 is connected to a third node 524 and a second terminal of first resistor R1 506 is connected to first node 520. A first terminal of second resistor R2 508 is connected to third node 524 and a second terminal of second resistor R2 508 is connected to a second node 522. A first terminal of third resistor R3 510 is connected to second node 522 and a second terminal of third resistor R3 510 is connected to second transistor 504. Second transistor Q2 504 is connected between third resistor R3 510 and ground. In some examples, first transistor Q1 502 and second transistor Q2

504 are bipolar junction transistors (BJTs). However, other types of transistors are within the scope of the disclosure.

A first input terminal of third comparator 514 is connected to first node 520 and a second input terminal of third comparator 514 is connected to second node 522. An output terminal of third comparator 514 is connected to a fourth node 526. First current mirror 516 is connected to third node 524 and sinks a first matched current at third node 524. Second current mirror 518 is connected to a first terminal of fourth resistor R4 512 and sinks a second matched current into fourth resistor R4 512. A control gate for each of first current mirror 516 and second current mirror is connected to the output terminal of third comparator 514 at fourth node 526. A second terminal of fourth resistor R4 512 is connected to ground.

In examples, a voltage of first node 520 is represented as v1 and a voltage of second node 522 is represented by v2. Third comparator 514 compares v1 with v2 and based on the comparison regulates the first matched current and the second matched currents being sinked by first current mirror 516 and second current mirror 518 respectively. For example, third comparator 514 regulates the first matched current and the second matched currents being sinked by first current mirror 516 and second current mirror 518 respectively such that v1 is approximately equal to v2. In examples, first matched current being sinked by first current mirror 516 is approximately equal to the second matched current being sinked by second current mirror 518.

In examples, a current flowing through first resistor R1 506 is represented as I1, a current flowing through second resistor R2 508 is represented as I2, and a current flowing through fourth resistor R4 512 is represented as I3. In some examples, a resistance value of first resistor R1 506, represented as R1, is approximately equal to a resistance value of second resistor R2 508 represented as R2. That is, R1=R2. In addition, since v1 is approximately equal to v2, I1 is approximately equal to I2. Hence, using BJT equations:

$$I_2 = \frac{V_{BE1} - V_{BE2}}{R_3} = \frac{V_T \ln\frac{I_C}{I_S} V_T \ln\frac{I_C}{nI_S}}{R_3} = \frac{V_T \ln n}{R_3}$$

$$IPTAT = I_3 = KI_2 = \frac{KV_T \ln n}{R_3}$$

where $V_T$ is linearly proportional to temperature and n is the ratio of emitter areas of transistors Q1 and Q2. I3 is proportional to I2 applied to the gate of second current mirror 518 by a factor of K. Because $V_T$ varies linearly with temperature, IPTAT (that is, the PTAT current) also varies linearly with temperature.

Figure 6:
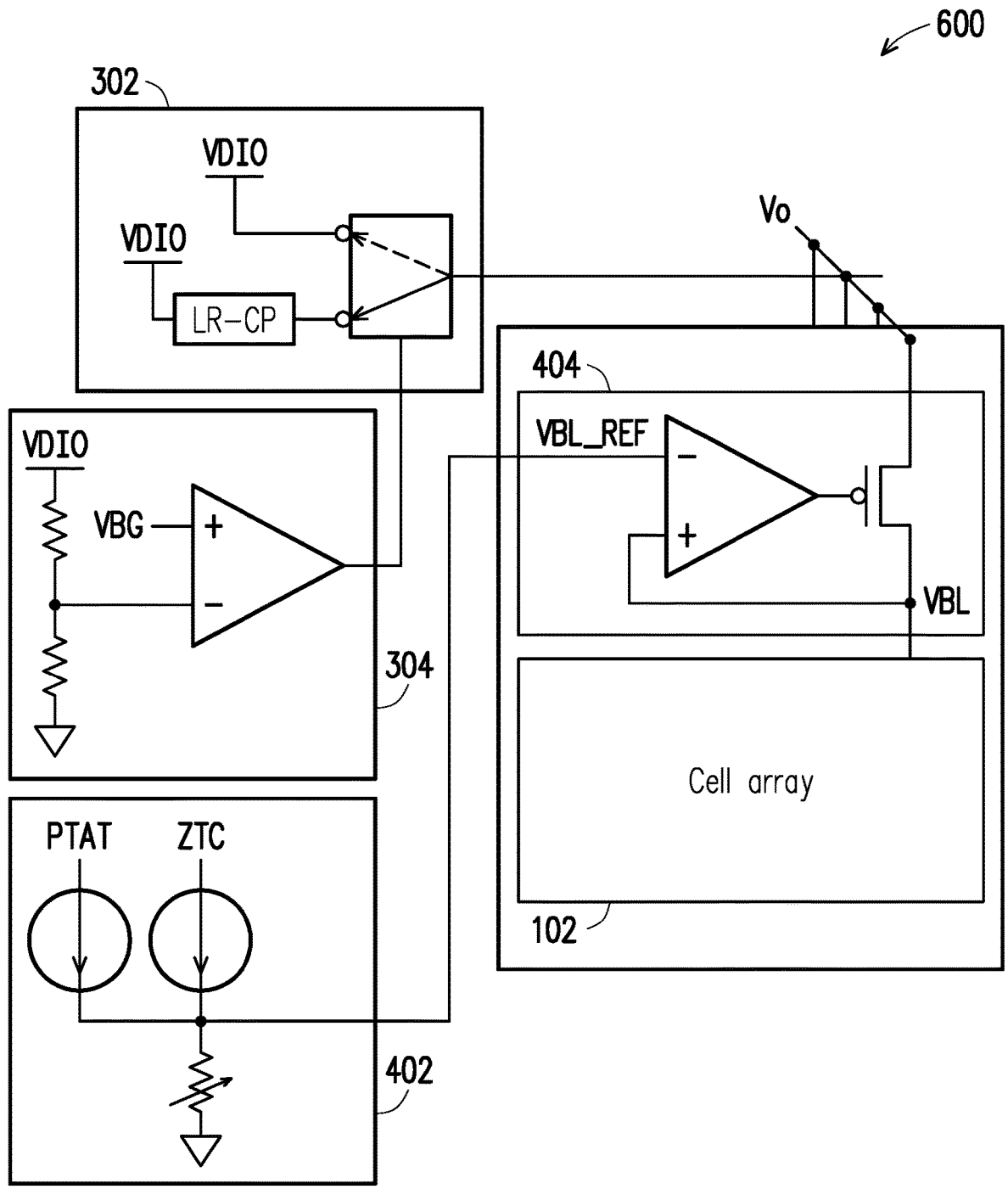
FIG. 6 is a block diagram illustrating a memory device with write voltage circuit in accordance with example embodiments.

FIG. 6 is a block diagram illustrating a memory device 600 with write voltage circuit 108 in accordance with example embodiments. As shown in FIG. 6, memory device 600 includes voltage source selection circuit 302 and voltage detection circuit 304 connected to voltage source selection circuit 302. In addition, and as shown in FIG. 6, memory device 600 further includes reference voltage generator circuit 402 and voltage regulator circuit 404 connected to reference voltage generator circuit 402. Voltage source selection circuit 302 is connected to voltage regulator circuit 404. Moreover, voltage regulator circuit 404 is connected to cell array 102.

Voltage detection circuit 304 detects an instantaneous supply voltage (also referred to as VDIO) and provides the detected instantaneous supply voltage to voltage source selection circuit 302. Voltage source selection circuit 302 selects a voltage source from plurality of voltage sources 306 based on the detected instantaneous supply voltage. For example, voltage source selection circuit 302 includes switch 308 that connects the selected voltage source to a selected bit line to provide a write voltage (that is, Vo). Reference voltage generator circuit 402 generates a temperature compensated reference voltage and provides the temperature compensated reference voltage to voltage regulator circuit 404. Voltage regulator circuit 404 compares the temperature compensated reference voltage with an instantaneous bit line voltage (that is, VBL) and adjusts the instantaneous bit line voltage (that is, VBL) based on the comparison. In example embodiments, voltage source selection circuit 302, voltage detection circuit 304, and reference voltage generator circuit 402 can be shared with multiple cell arrays of memory device 600.

Figure 7:
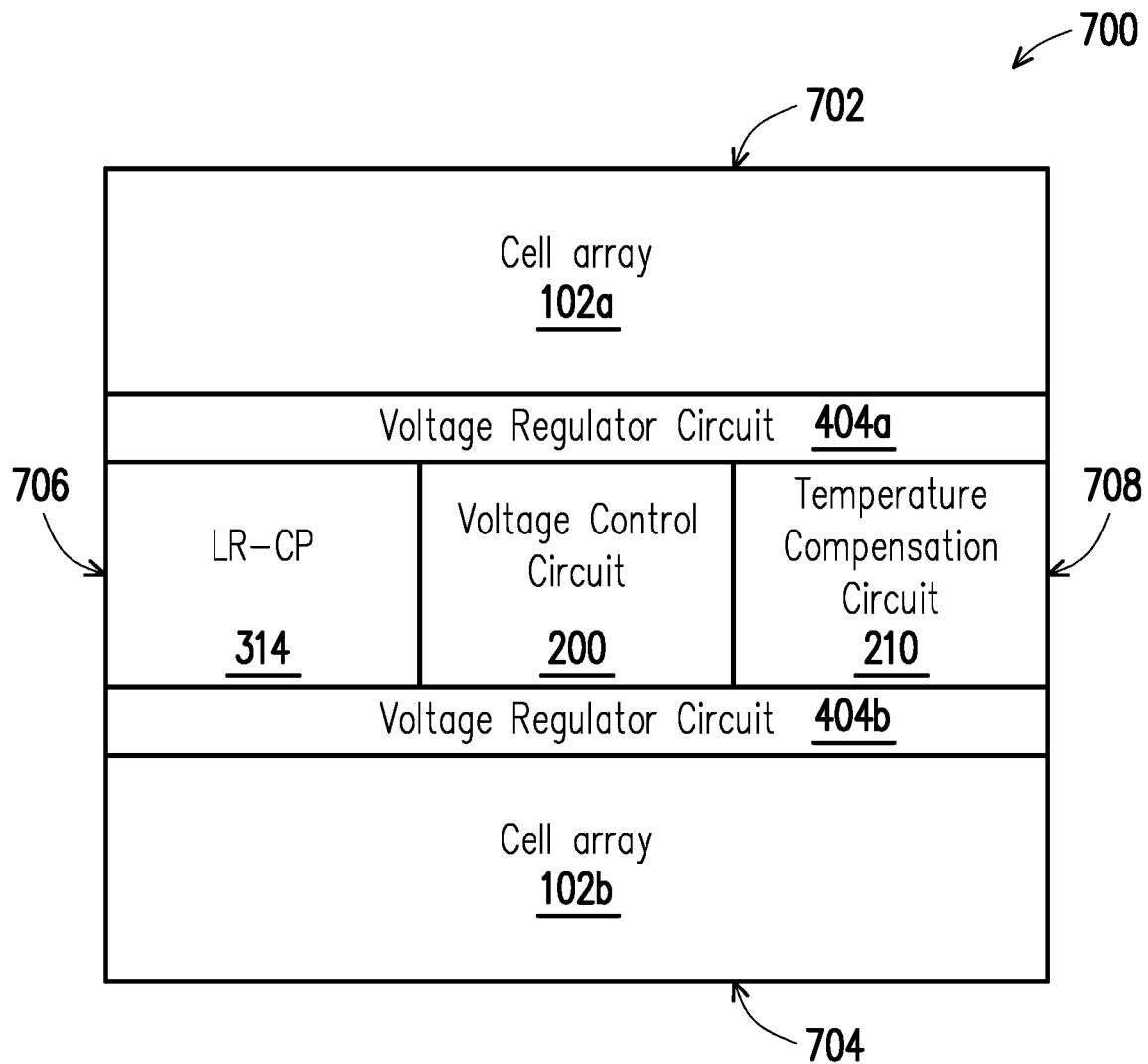
FIG. 7 is a block diagram illustrating placement of components in an example memory device in accordance with example embodiments.

FIG. 7 is a block diagram illustrating placement of components in an example memory device 700 in accordance with example embodiments. As shown in FIG. 7, a first cell array 102a is placed in a first section of a cell area. The first section extends along a first edge 702 from a third edge 706 of the cell area to an opposite fourth edge 708. A second cell array 102b is placed in a second section of the cell area. The second section extends along a second edge 704 from third edge 706 of the cell area to fourth edge 708. Second edge 704 is opposite first edge 702.

A first voltage regulator circuit 404a is placed in a third section of the cell area. The third section is adjacent to the first section. The third section extends along the first section from third edge 706 to fourth edge 708. A second voltage regulator circuit 404b is placed in a fourth section of the cell area. The fourth section is adjacent to the second section. The fourth section extends along the second section from third edge 706 to fourth edge 708. LR-CP 314, voltage control circuit 200, and temperature compensation circuit 210 is placed in a fifth section of the cell area. The fifth section is sandwiched between the third section and the fourth section and extends from edge 706 to fourth edge 708.

For example, LR-CP 314 is placed in a first sub-section of the fifth section. Voltage control circuit 200 is placed in a second sub-section of the fifth section. The second sub-section is next to or proximate to the first sub-section. Temperature compensation circuit 210 is placed in a third sub-section of the fifth section. The third sub-section is next to or proximate to the second sub-section. The second sub-section is sandwiched between the first sub-section and the third sub-section. Thus, voltage control circuit 200 is placed next to or in proximity to LR-CP 314. In addition, temperature compensation circuit 210 is placed next to or in proximity to voltage control circuit 200. However, other placements are within the scope of the disclosure.

Figure 8:
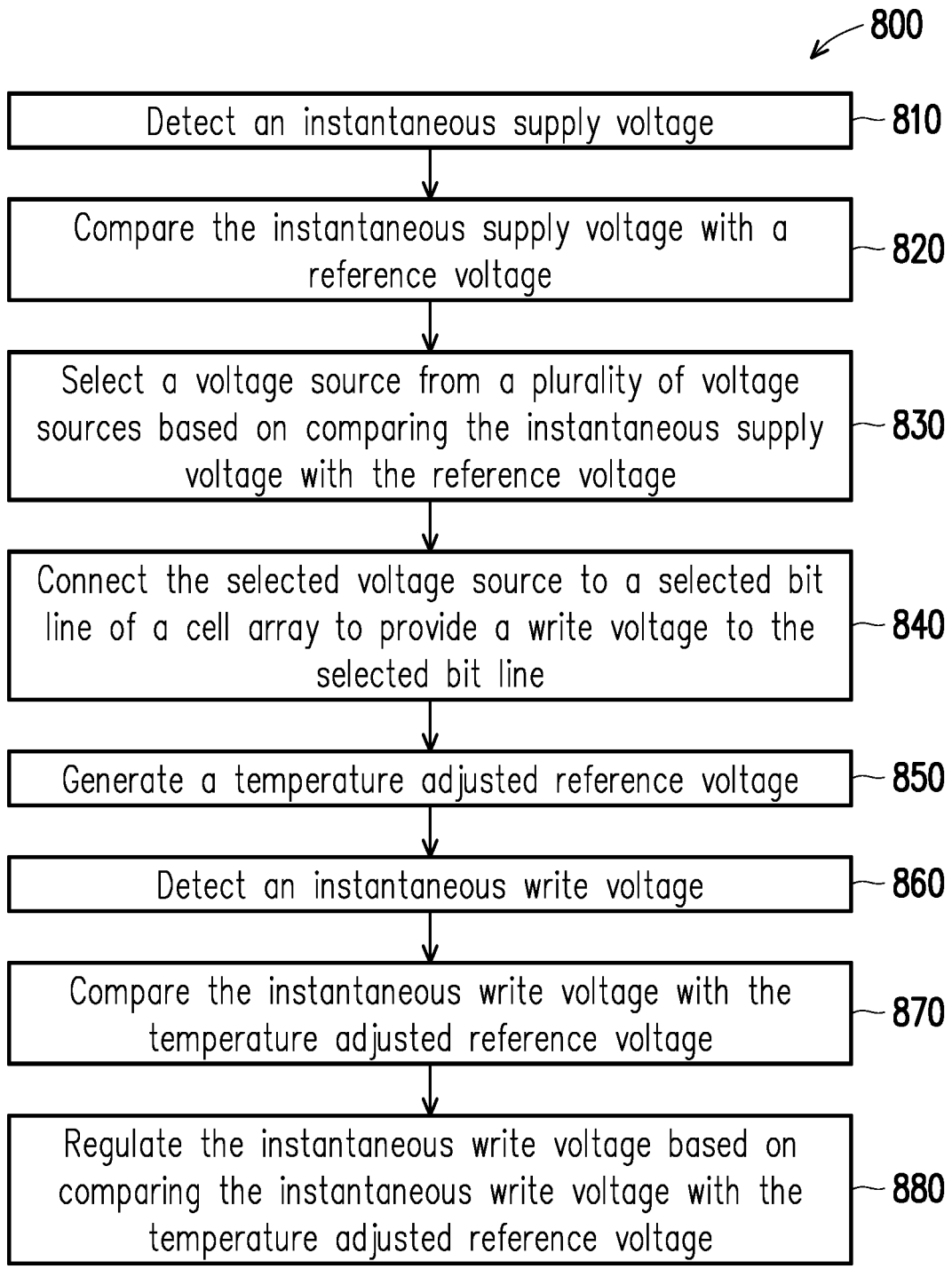
FIG. 8 is a flowchart of a method for providing a write voltage to a memory device in accordance with some embodiments.

FIG. 8 is a flowchart of a method 800 for providing a write voltage to a memory device in accordance with some embodiments. The method 800 can be performed, for example, by write voltage circuit 108 as discussed with reference to any of FIGS. 1A-7. In some embodiments, method 800 can be stored as instructions on a non-transitory computer readable medium which can be executed by a processor to perform method 800.

At block 810 of method 800, an instantaneous supply voltage is detected. For example, resistor ladder 316 of voltage detection circuit 304 detects an instantaneous supply voltage. A voltage signal representative of the instantaneous supply voltage is provided at reference node 334.

At block 820 of method 800, the instantaneous supply voltage is compared with a reference voltage. For example, first comparator 318 of voltage detection circuit compares the instantaneous supply voltage with the reference voltage. The instantaneous supply voltage is provided at second input terminal 322 of first comparator 318 and the reference voltage is provided at first input terminal 320 of first comparator 318.

At block 830 of method 800, a voltage source from a plurality of voltage sources is selected based on comparing the instantaneous supply voltage with the reference voltage. For example, first comparator 318 provides an output signal having comparison results at output terminal 324. The output signal, for example, may indicate whether the instantaneous supply voltage is less than, equal to, or greater than the reference voltage. The output signal having the comparison results is provided to switch 308 of voltage source selection circuit 302. Switch 308 then selects one of plurality of voltage sources 306 based on the comparison results. For example, switch 308 selects first voltage source 306a when the instantaneous supply voltage is equal to or greater than the reference voltage. In other examples, switch 310 selects second voltage source 306b when the instantaneous supply voltage is less than reference voltage.

At block 840 of method 800, the selected voltage source is connected to a selected bit line of a cell array to provide a write voltage to the selected bit line. For example, switch 308 of voltage source selection circuit 302 connects the selected voltage source to a selected bit line of a cell array through switch input terminal 310 and switch output terminal 312 to provide a write voltage to the selected bit line.

At block 850 of method 800, a temperature adjusted reference voltage is generated. For example, reference voltage generator circuit 402 generates a temperature adjusted reference voltage. In example embodiments, the temperature adjusted reference voltage is generated using first current source 406 (that is, the PTAT current source) and second current source 408 (that is, the ZTC current source). The temperature adjusted reference voltage is provided at output terminal 414 of reference voltage generator circuit 402.

At block 860 of method 800, an instantaneous write voltage is detected. At block 870 of method 800, the instantaneous write voltage is compared with the temperature adjusted reference voltage. In example embodiments, second comparator 416 of voltage regulator circuit 404 compares the instantaneous write voltage with the temperature adjusted reference voltage. The temperature adjusted reference voltage is provided at first input terminal 420 of second comparator 416 and the instantaneous write voltage is provided at second input terminal 422 of second comparator 416.

At block 880 of method 800, the instantaneous write voltage is regulated based on comparing the instantaneous write voltage with the temperature adjusted reference voltage. For example, second comparator 416 provides an output signal having comparison results at output terminal 424. The output signal, for example, may indicate whether the instantaneous write voltage is less than, equal to, or greater than the temperature adjusted reference voltage. The output signal having the comparison results is provided to a gate of third current source 418. Third current source 418 then increases or decreases the source current Is being sinked to the selected bit line. For example, third current source 418 decreases the source current Is being sinked to the selected bit line when the instantaneous write voltage is equal to or greater than the temperature adjusted reference voltage. In other examples, third current source 418 increases the source current Is being sinked to the selected bit line when the instantaneous write voltage is less than the temperature adjusted reference voltage.

Disclosed embodiments thus provide a memory device comprising: a plurality of cells arranged in a matrix comprising a plurality of rows and a plurality of columns; a plurality of bit lines, wherein each of the plurality of bit lines is connected to a first plurality of cells of the plurality of cells arranged in a column of the plurality of columns; a voltage control circuit connectable to a selected bit line of the plurality of bit lines, wherein the voltage control circuit comprises: a voltage detection circuit, wherein the voltage detection circuit detects an instantaneous supply voltage; and a voltage source selection circuit connected to the voltage detection circuit, wherein the voltage source selection circuit selects a voltage source from a plurality of voltage sources based on the detected instantaneous supply voltage, and wherein the voltage source selection circuit comprises a switch that connects the selected voltage source to the selected bit line to provide a write voltage.

In accordance with other disclosed examples, a memory device comprises: a cell array comprising a plurality of cells; a plurality of bit lines, wherein each of the plurality of bit lines is connected to a first plurality of cells of the plurality of cells arranged in a column of the cell array; a voltage control circuit connectable to a selected bit line of the plurality of bit lines, wherein the voltage control circuit provides a write voltage to a selected bit line of the plurality of bit lines for a write operation; and a temperature compensation circuit connectable to the selected bit line, wherein the temperature compensation circuit comprises: a reference voltage generator circuit, wherein the reference voltage generator circuit generates a temperature adjusted reference voltage, and a voltage regulator circuit connected to the reference voltage generator circuit, wherein the voltage regulator circuit compares an instantaneous write voltage with the temperature adjusted reference voltage and regulates the instantaneous write voltage based on the comparison.

In accordance with still further disclosed examples, a method of providing a write voltage comprises: detecting an instantaneous supply voltage; comparing the instantaneous supply voltage with a reference voltage; selecting a voltage source from a plurality of voltage sources based on comparing of the instantaneous supply voltage with the reference voltage; and connecting the selected voltage source to a selected bit line of a cell array to provide a write voltage to the selected bit line. In example embodiments, the method further comprises: generating a temperature adjusted reference voltage; detecting an instantaneous write voltage; comparing the instantaneous write voltage with the temperature adjusted reference voltage; and regulating the instantaneous write voltage based on comparing the instantaneous write voltage with the temperature adjusted reference voltage.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a plurality of cells arranged in a matrix comprising a plurality of rows and a plurality of columns;
a plurality of bit lines, wherein each of the plurality of bit lines is connected to a first plurality of cells of the plurality of cells arranged in a column of the plurality of columns; and
a voltage control circuit connectable to a selected bit line of the plurality of bit lines, wherein the voltage control circuit comprises:
a voltage detection circuit, wherein the voltage detection circuit detects an instantaneous supply voltage; and
a voltage source selection circuit connected to the voltage detection circuit, wherein the voltage source selection circuit selects a voltage source from a plurality of voltage sources based on the detected instantaneous supply voltage, and wherein the voltage source selection circuit comprises a switch that connects the selected voltage source to the selected bit line to provide a write voltage.

2. The memory device of claim 1, wherein the voltage detection circuit comprises a resistor ladder connected to a supply voltage node and a comparator connected to the resistor ladder, wherein the resistor ladder detects the instantaneous supply voltage, and wherein the comparator compares the detected instantaneous supply voltage with a reference voltage.

3. The memory device of claim 2, wherein an output terminal of the comparator is connected to the switch, and wherein the switch selects the voltage source from the plurality of voltage sources based on an output of the comparator.

4. The memory device of claim 3, wherein the switch selects a first voltage source of the plurality of voltages sources when the instantaneous supply voltage is less than the reference voltage, and wherein the switch selects a second voltage source of the plurality of voltage sources when the instantaneous supply voltage is more than the reference voltage.

5. The memory device of claim 2, wherein the voltage control circuit further comprises a timer, wherein the timer tracks a time period and generates, after expiration of the time period, a comparator enable signal, wherein the comparator enable signal triggers the comparator to compare the detected instantaneous supply voltage with the reference voltage.

6. The memory device of claim 5, wherein the voltage control circuit further comprises a latch circuit, wherein the latch circuit latches the output of the comparator.

7. The memory device of claim 6, wherein the latch circuit is triggered by a clock signal, wherein the clock signal is generated by the timer.

8. The memory device of claim 6, wherein the voltage detection circuit is switched off after latching of the output.

9. The memory device of claim 2, wherein the resistor ladder comprises a first resistor and a second resistor, wherein a first terminal of the first resistor is connected to a first supply voltage node, wherein a second terminal of the first resistor is connected to an output node, wherein a first terminal of the second resistor is connected to the output node, wherein a second terminal of the second resistor is connected to ground, and wherein the output node provides the instantaneous supply voltage.

10. The memory device of claim 9, wherein a first input terminal of the comparator is connected to the output node, and wherein a second input terminal of the comparator is connected to a reference voltage node.

11. The memory device of claim 1, further comprising a temperature compensation circuit connectable to the selected bit line, wherein the temperature compensation circuit compensates the write voltage for a variation in a temperature of the memory device.

12. A memory device, comprising:
a cell array comprising a plurality of cells;
a plurality of bit lines, wherein each of the plurality of bit lines is connected to a first plurality of cells of the plurality of cells arranged in a column of the cell array;
a voltage control circuit connectable to a selected bit line of the plurality of bit lines, wherein the voltage control circuit provides a write voltage to the selected bit line of the plurality of bit lines for a write operation; and
a temperature compensation circuit connectable to the selected bit line, wherein the temperature compensation circuit comprises:
a reference voltage generator circuit, wherein the reference voltage generator circuit generates a temperature adjusted reference voltage, and
a voltage regulator circuit connected to the reference voltage generator circuit, wherein the voltage regulator circuit compares an instantaneous write voltage with the temperature adjusted reference voltage and regulates the instantaneous write voltage based on the comparison.

13. The memory device of claim 12, wherein the reference voltage generator circuit comprises:
a first current source;
a second current source connected in parallel to the first current source at a reference node; and
a variable resistor connected between the reference node and ground, wherein the reference node provides the temperature adjusted reference voltage.

14. The memory device of claim 13, wherein the first current source is a Proportional to Absolute Temperature (PTAT) current source and the second current source is a Zero Temperature Coefficient (ZTC) current source.

15. The memory device of claim 12, wherein the voltage regulator circuit comprises an amplifier and a third current source, wherein the amplifier comprises a first input terminal, a second input terminal, and an output terminal, wherein the first input terminal of the amplifier is connected to a reference voltage node, wherein the second input terminal of the amplifier is connected to the selected bit line, and wherein the output terminal of the amplifier is connected to the third current source.

16. The memory device of claim 15, wherein the amplifier regulates an amount of current sinked by the third current source to the selected bit line based on comparing the instantaneous write voltage with the temperature compensated reference voltage.

17. The memory device of claim 12, further comprising a unigain buffer connected between the reference voltage generator circuit and the voltage regulator circuit.

18. The memory device of claim 12, wherein the voltage regulator circuit comprises a low dropout (LDO) circuit.

19. A method of providing a write voltage, the method comprising:
detecting an instantaneous supply voltage;
comparing the instantaneous supply voltage with a reference voltage;
selecting a voltage source from a plurality of voltage sources based on comparison of the instantaneous supply voltage with the reference voltage; and connecting the selected voltage source to a selected bit line of a cell array to provide the write voltage to the selected bit line.

20. The method of claim 19, further comprising:

generating a temperature adjusted reference voltage;

detecting an instantaneous write voltage;

comparing the instantaneous write voltage with the temperature adjusted reference voltage; and regulating the instantaneous write voltage based on comparing the instantaneous write voltage with the temperature adjusted reference voltage.

\* \* \* \* \*

UNITED STATES PATENT AND TRADEMARK OFFICE
CERTIFICATE OF CORRECTION

| | |
|---|---|
| PATENT NO. | : 11,393,512 B2 |
| APPLICATION NO. | : 17/061600 |
| DATED | : July 19, 2022 |
| INVENTOR(S) | : Chien-An Lai et al. |

It is certified that error appears in the above-identified patent and that said Letters Patent is hereby corrected as shown below:

In the Specification

Column 3, Lines 16-17: "110*al*, 110 ml. Lastly," should read --110a1, ..., 110m1. Lastly,--

Column 3, Line 22: "110*al*, . . . , 110an." should read --110a1, ..., 110an.--

Column 3, Line 43: "110*al*," should read --110a1,--

Column 3, Line 56: "110*al*," should read --110a1,--

In the Claims

Column 13, Line 60, Claim 9: "first supply voltage" should read --supply voltage--

Signed and Sealed this
Twenty-seventh Day of June, 2023

Katherine Kelly Vidal
*Director of the United States Patent and Trademark Office*